(12) United States Patent
Lee

(10) Patent No.: US 8,786,324 B1
(45) Date of Patent: Jul. 22, 2014

(54) MIXED VOLTAGE DRIVING CIRCUIT

(71) Applicant: VIA Technologies, Inc., New Taipei (TW)

(72) Inventor: Yeong-Sheng Lee, Fremont, CA (US)

(73) Assignee: Via Technologies, Inc., New Taipei (TW)

( * ) Notice: Subject to any disclaimer, the term of this patent is extended or adjusted under 35 U.S.C. 154(b) by 0 days.

(21) Appl. No.: 13/974,426

(22) Filed: Aug. 23, 2013

Related U.S. Application Data

(63) Continuation-in-part of application No. 13/892,570, filed on May 13, 2013.

(51) Int. Cl.
*H03K 17/16* (2006.01)
(52) U.S. Cl.
CPC ....................................... *H03K 17/16* (2013.01)
USPC ............................................. 327/108; 326/63
(58) Field of Classification Search
None
See application file for complete search history.

(56) References Cited

U.S. PATENT DOCUMENTS

| | | | |
|---|---|---|---|
| 5,579,193 A * | 11/1996 | Schmidt et al. ................. | 361/18 |
| 5,754,065 A * | 5/1998 | Wong ............................. | 327/108 |
| 6,970,044 B2 * | 11/2005 | Inagaki ........................... | 330/255 |
| 7,268,596 B2 * | 9/2007 | Ota et al. ....................... | 327/112 |
| 7,639,059 B1 * | 12/2009 | Yu et al. ......................... | 327/333 |
| 8,390,345 B2 * | 3/2013 | Kim et al. ....................... | 327/134 |
| 8,456,404 B2 * | 6/2013 | Tonomura ....................... | 345/98 |
| 2003/0042938 A1 * | 3/2003 | Shvarts .......................... | 327/108 |
| 2007/0279107 A1 * | 12/2007 | Nuebling et al. .............. | 327/110 |
| 2009/0015299 A1 * | 1/2009 | Ryu et al. ....................... | 327/108 |
| 2010/0283439 A1 * | 11/2010 | Singh et al. .................... | 323/282 |
| 2013/0162305 A1 * | 6/2013 | Watanabe ....................... | 327/109 |
| 2013/0176006 A1 * | 7/2013 | van Ettinger et al. ......... | 323/265 |

* cited by examiner

*Primary Examiner* — Thomas J Hiltunen
(74) *Attorney, Agent, or Firm* — McClure, Qualey & Rodack, LLP

(57) ABSTRACT

A driving circuit is provided. The driving circuit is configured to generate an output signal according to an input signal generated from an input-stage voltage with a first voltage level and a reference voltage with a second voltage level. The driving circuit has a differential amplifier and an output stage. The differential amplifier has a first input terminal coupled to the reference voltage, a second input terminal coupled to the output signal, and an output terminal. The differential amplifier is supplied by an operation voltage with a third voltage level. The output stage is configured to receive the input signal and the operation voltage to generate the output signal. The second input terminal is coupled to the output terminal of the differential amplifier according to the input signal. The operation voltage is generated according to the input signal and the input-stage voltage.

20 Claims, 11 Drawing Sheets

MIXED VOLTAGE DRIVING CIRCUIT

CROSS REFERENCE TO RELATED APPLICATIONS

This application is a continuation-in-part application of co-pending U.S. application Ser. No. 13/892,570, filed May 13, 2013, the contents of which are incorporated herein by reference.

BACKGROUND OF THE INVENTION

1. Field of the Invention

The present invention relates to a driving circuit, and in particular, to a driving circuit configured to solve mixed voltage issues in current portable systems.

2. Description of the Related Art

Recently, mixed voltage sources are commonly adapted to different components, such as analog circuits and digital circuits, of an integrated circuit (IC) in a portable system or any electronic system. For example, analog circuits and digital circuits in an IC may use different voltage levels. In addition, an extra voltage level other than the two voltage sources used in the analog circuits and digital circuits might be further used in the same IC due to IC manufacturing process issues. That is, some cells or components in the IC may be required to be supplied with an extra voltage level. Accordingly, a complicated driving circuit is usually used in the conventional IC for providing the extra voltage level, which hinders miniaturization and increases power consumption thereof.

BRIEF SUMMARY OF THE INVENTION

A detailed description is assuming in the following embodiments with reference to the accompanying drawings.

In an exemplary embodiment, a driving circuit is provided. The driving circuit is configured to generate an output signal according to an input signal generated from an input-stage voltage with a first voltage level and a reference voltage with a second voltage level. The driving circuit comprises a differential amplifier and an output stage. The differential amplifier comprises a first input terminal coupled to the reference voltage, a second input terminal coupled to the output signal, and an output terminal. The differential amplifier is supplied by an operation voltage with a third voltage level. The output stage is coupled to the second input terminal and the output terminal of the differential amplifier and is configured to receive the input signal and the operation voltage to generate the output signal. The second input terminal is coupled to the output terminal of the differential amplifier according to the input signal. The first voltage level is lower than the third voltage level, and the second voltage level is between the first voltage level and the third voltage level. The operation voltage is generated according to the input signal and the input-stage voltage.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
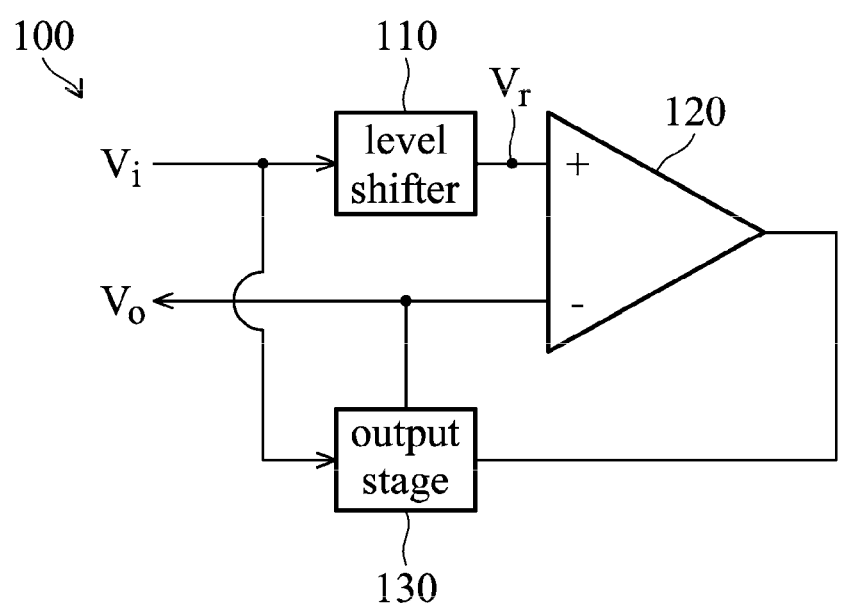
FIG. 1 is a block diagram of a driving circuit 100 according to an embodiment of the invention.

Systems may have different voltage levels for operation voltages for analog circuits (such as 1.8V) and digital circuits (such as 1.0V). Different specifications may further require using signal voltage levels different from these operation voltages. For example, the MIPI (Mobile Industry Processor Interface) specification requires generating an output signal with voltage levels of 0V and 1.2V. Therefore, a driving circuit to generate such voltage levels with driving capability is required. FIG. 1 is a block diagram of a driving circuit 100 according to an embodiment of the invention. The driving circuit 100 may comprise a level shifter 110, a differential amplifier 120, and an output stage 130. Referring to FIG. 1, the level shifter 110 may be coupled to an input signal $V_i$ (having a first voltage level) and a reference voltage $V_{ref}$ (having a second voltage level), and output a reference signal $V_r$ to a first input terminal (e.g. the positive terminal in FIG. 1) of the differential amplifier 120. The second voltage level of the reference voltage $V_{ref}$ represents the desired voltage level of the output signal $V_o$ of the driving circuit 100, and may be generated by a bandgap voltage reference circuit which does not have current driving capability (details will be discussed later). The output terminal of the differential amplifier 120 and the second input terminal of the differential amplifier 120 are coupled to the output stage 130. The output stage 130 is also coupled to the input signal $V_i$ as another input, and provides an output signal $V_o$, which is the output of the driving circuit 100. The differential amplifier 120 and the output stage 130 may both be operated by an operation voltage having a third voltage level. In one embodiment, the third voltage level is higher than the first voltage level, and the second voltage level is in between of the first and third voltage level. When a negative feedback loop is formed via the output stage 130, the first and second input terminals of the differential amplifier 120 become virtually shorted, and thus the signal at the second input terminal of the differential amplifier 120 (i.e., $V_o$) is exactly the same as the reference signal $V_r$ at the first input terminal of the differential amplifier 120.

Figure 2A:
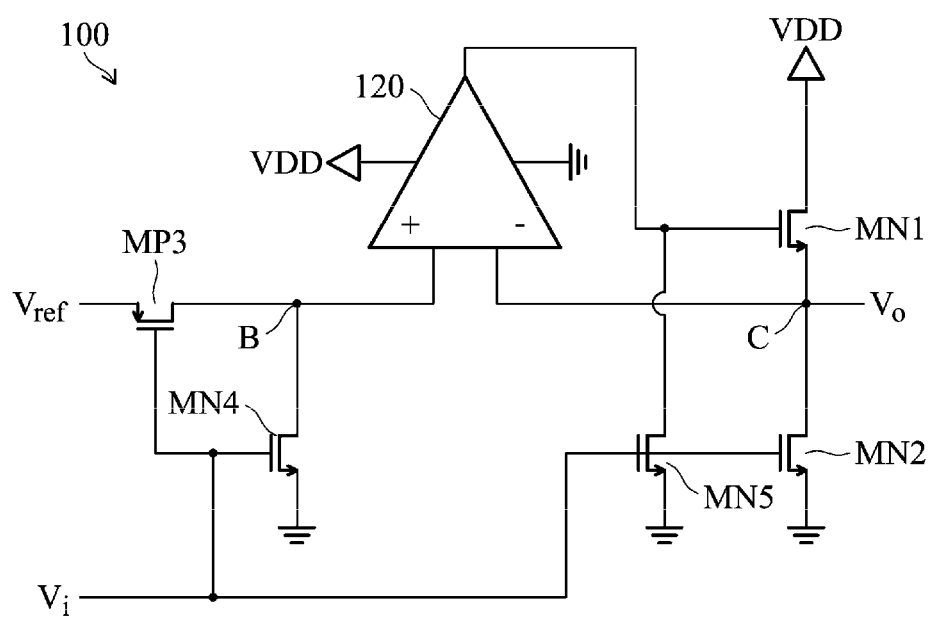
FIG. 2A is a detailed circuit schematic diagram of the driving circuit 100 according to an embodiment of the invention.

FIG. 2A is a detailed circuit schematic diagram of the driving circuit 100 according to an embodiment of the invention. The operations of each component of the driving circuit 100 will be described. The operations of the level shifter 110 are based on the input signal $V_i$. The input signal $V_i$ is coupled to the gate of a P-type field-effect transistor (hereinafter as PFET) MP3 and the gate of an N-type field-effect transistor (hereinafter as NFET) MN4. The source terminal of the NFET MN4 is coupled to the ground. The source terminal of the PFET MP3 is coupled to the reference voltage $V_{ref}$. The drain terminals of the NFET MN4 and the PFET MP3 are both coupled at node B to the first input terminal of the differential amplifier 120. Accordingly, the reference signal $V_r$ can be obtained at the node B according to the input signal $V_i$. For example, assuming that $V_i$ is at a low logic level of 0V and $V_{ref}$ is at a fixed voltage of 1.2V, the PFET MP3 is turned on and the NFET MN4 is turned off, so that the reference signal $V_r$ is approximately at a voltage level of 1.2V. Assuming that $V_i$ is at a high logic level of 1.0V, the NFET MN4 will be turned on, so that the reference signal $V_r$ at the node B will be pulled down to 0V. The operations of the output stage 130 are also based on the input signal $V_i$. The output stage 130 comprises NFETs MN1, MN2, and MN5. Both the gate terminals of NFET MN2 and MN5 are controlled by the input signal $V_i$, and both the source terminals of NFET MN2 and MN5 are coupled to ground. The drain terminal of the NFET MN5 is coupled to the output terminal of the differential amplifier 120, and the drain terminal of the NFET MN2 is coupled to the second input terminal of the differential amplifier 120 which provides the output signal $V_o$. NFET MN1 has a gate terminal coupled to the output terminal of the differential amplifier 120, a source terminal coupled to the second input terminal of the differential amplifier 120, and a drain terminal coupled to an operation voltage VDD. Accordingly, a negative feedback loop can be established at the differential amplifier 120 according to the input signal $V_i$. For example, assuming that $V_i$ is at a low logic level of 0V, the NFETs MN2 and MN5 are turned off, so that the NFET MN1 forms a negative feedback loop from the output terminal to the second input terminal of the differential amplifier 120. Therefore, the first and second input terminals of the differential amplifier 120 become a virtual short, and thus the output signal $V_o$ at the second input terminal of the differential amplifier 120 is exactly the same as the reference signal $V_r$ at the first input terminal of the differential amplifier 120 (which is now approximately 1.2V as discussed above). Assuming that $V_i$ is at a high logic level of 1.0V, the transistors MN2 and MN5 are turned on, so that the NFET MN1 is turned off and there is no feedback loop. The output signal $V_o$ will be pulled down to 0V by NFET MN2. During this time, the reference signal $V_r$ also happens to be 0V as discussed above; however, this is not due to virtual short. The pull-up NFET MN1 and pull-down NFET MN2 of the output stage 130 provides driving capability to drive subsequent circuits. In addition, since both pull-up and pull-down transistors are fabricated by NFETs, it can save chip area because the driving capability of NFETs is typically two to three times higher than that of PFETs. The differential amplifier 120 may also be operated by the operation voltage VDD having a third voltage level (e.g., 1.8V). In another embodiment, the reference voltage $V_{ref}$ may be directly coupled to the first input terminal of the differential amplifier 120 without the level shifter 110. Since virtual short between the first and second input terminals of the differential amplifier 120 is not established when $V_i$ is at a high logic level, the output signal $V_o$ will be pulled down to 0V regardless of the signal level at the first input terminal of the differential amplifier 120. In another embodiment, the field-effect transistors may be substituted with bipolar-junction transistors.

Figure 2B:
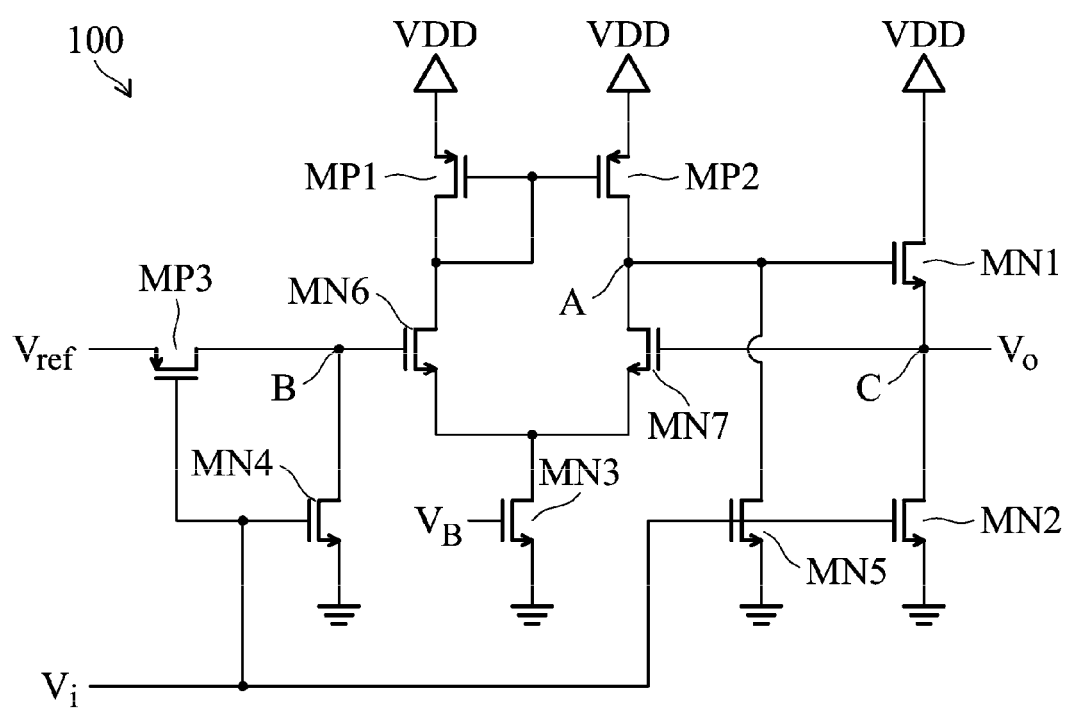
FIG. 2B shows an example of the differential amplifier 120 of the driving circuit 100 according to an embodiment of the invention.

FIG. 2B shows an example of the differential amplifier 120 of the driving circuit 100 according to an embodiment of the invention. As illustrated in FIG. 2B, an exemplary differential amplifier 120 is supplied with an operation voltage VDD (such as 1.8V), and provides an output voltage $V_a$ at the node A (i.e., the output terminal of the differential amplifier 120). The differential amplifier 120 is coupled to the operation voltage VDD via the PFET pair MP1 and MP2, and is coupled to ground via the NFET MN3. The gate terminal of NFET MN3 is controlled by a bias voltage $V_B$, which is capable of turning on/off the NFET MN3 to enable/disable the differential amplifier 120. In another embodiment, the differential amplifier 120 is coupled to ground via a current source (i.e., the source terminals of the NFETs MN6 and MN7 are coupled to a current source which is coupled to ground). The first input terminal (i.e. gate terminal of the transistor MN6) of the differential amplifier 120 is coupled to the node B having the reference signal $V_r$. The second input terminal (i.e. gate terminal of the transistor MN7) is coupled to the node C at the output stage 130, thereby providing the output signal $V_o$ of the driving circuit 100. Note that, for one having ordinary skill in the art, it is appreciated that the differential amplifier 120 can be implemented in various ways. In one embodiment, the differential amplifier 120 may be implemented with BJTs (bipolar junction transistor).

The output stage 130 is supplied with several input voltage levels, such as VDD, $V_a$, and $V_i$. For example, the drain terminal of the NFET MN1 is supplied with the operation voltage VDD. The gate terminal of the NFET MN1 and the drain terminal of the NFET MN5 are coupled to the node A having the voltage level $V_a$ (i.e., the output terminal of the differential amplifier 120). The gate terminal of the NFET MN5 and the gate terminal of the NFET MN2 are coupled to the input signal $V_i$. The source terminal of the NFET MN1 and the drain terminal of the NFET MN2 are both coupled to the second input terminal of the differential amplifier 120 (i.e. gate terminal of the NFET MN7). The source terminal of the NFET MN2 and the source terminal of the NFET MN5 are both coupled to the ground. For example, assuming that the input signal $V_i$ has a low logic level of 0V, the NFETs MN4, MN5 and MN2 are turned off. That is, the voltage level at the first input terminal (i.e. gate terminal of the NFET MN6, reference signal $V_r$) of the differential amplifier 120 is the reference voltage $V_{ref}$ (e.g. 1.2V). Meanwhile, the NFET MN1 is turned on and the output signal $V_o$ will be pulled high to the same voltage level of $V_r$ (e.g. 1.2V). For the example of VDD being 1.8V, $V_a$ is approximately 1.6V. Conversely, assuming that the input signal $V_i$ has a high logic level of 1V, the NFETs MN4, MN5, and MN2 are turned on. That is, the reference signal $V_r$ at the first input terminal (i.e. gate terminal of the NFET MN6) of the differential amplifier 120 and the output signal $V_o$ will be pulled down to 0V (i.e. ground).

Figure 3:
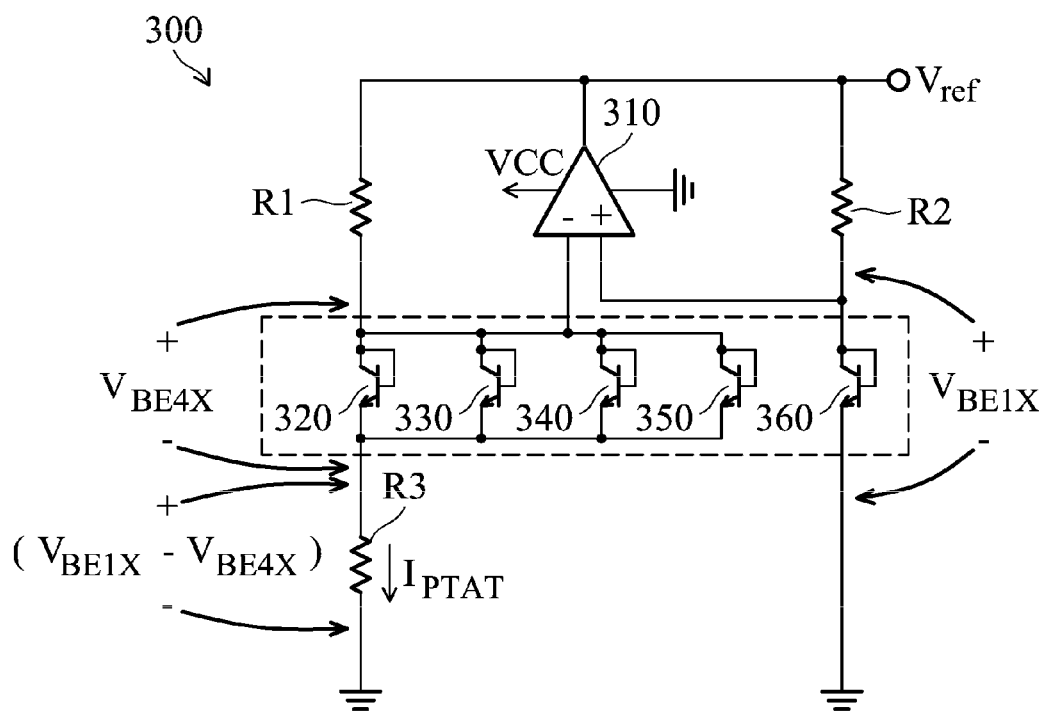
FIG. 3 is a circuit schematic diagram of a bandgap voltage reference circuit according to an embodiment of the invention.

FIG. 3 is a circuit schematic diagram of a bandgap voltage reference circuit according to an embodiment of the invention. A bandgap voltage reference circuit provides a very stable voltage reference in regard to both temperature and power supply variations. In an embodiment, the reference voltage $V_{ref}$ can be generated by a bandgap voltage reference circuit 300, as illustrated in FIG. 3. The operational amplifier 310 is supplied with a voltage power source VCC. The negative input terminal of the operational amplifier 310 is connected to the collector terminal of several identical bipolar-junction transistors (hereinafter as BJT) (e.g. BJTs 320~350)

which have a common collector terminal and a common emitter terminal. The base terminals of the BJTs 320~350 are connected to their common collector terminal. The positive input terminal of the operational amplifier 310 is connected to the collector terminal of the BJT 360. The resistances R1, R2 and R3 are, for example, 5K, 5K and 390 ohms, respectively. Accordingly, the voltage across the common collector terminal and the common emitter terminal of the BJTs 320~350 may be $V_{BE4X}$, and the voltage across the collector terminal of the BJT 360 and the ground is $V_{BE1X}$. Further, the current $I_{PTAT}$ through the resistance R3 is $(V_{BE1X}-V_{BE4X})/R3$. Therefore, the generated reference voltage $V_{ref}$ of the bandgap voltage reference circuit can be calculated by the following equation:

$$V_{ref}=V_{BE1X}+(V_{BE1X}-V_{BE4X})*(5K/390)$$

It should be noted that the output voltage $V_{ref}$ of the voltage reference circuit 300 may be a constant value of 1.2V. Specifically, although the voltages $V_{BE4X}$ and $V_{BE1X}$ may vary due to temperature changes, the difference between the voltages $V_{BE4X}$ and $V_{BE1X}$ may be kept at a constant value, so that the voltage level of $V_{ref}$ can be fixed approximately at 1.2V. However, since the bandgap voltage reference circuit 300 does not have pull-up and pull-down transistors to provide driving capability, the bandgap voltage reference circuit 300 cannot provide a sufficient current for driving other circuits. Thus, the driving current of the driving circuit 100 is mainly from the output stage 130.

Figure 4A:
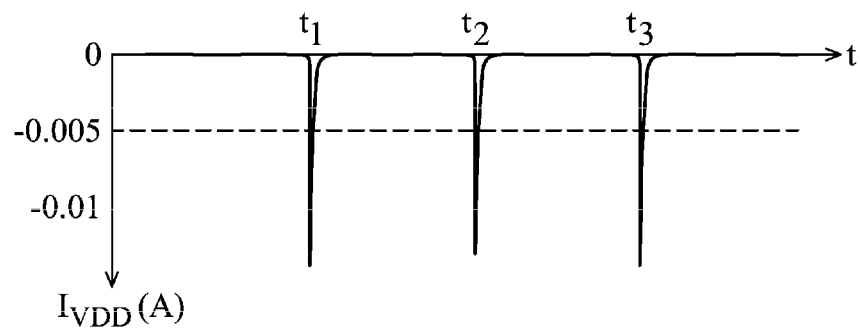
FIG. 4A to FIG. 4D are diagrams illustrating the relationship between various voltage levels and the driving current over time according to the embodiment of FIG. 2B of the invention.
Figure 4B:
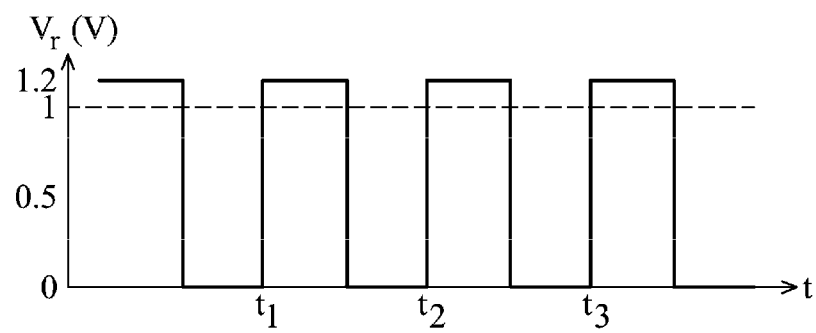
Figure 4C:
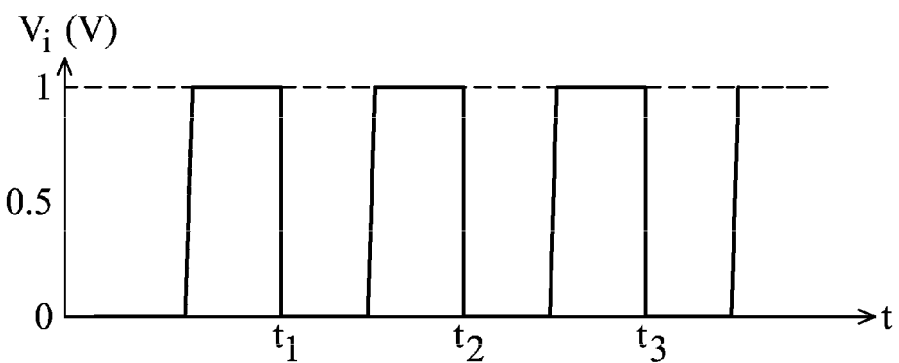
Figure 4D:
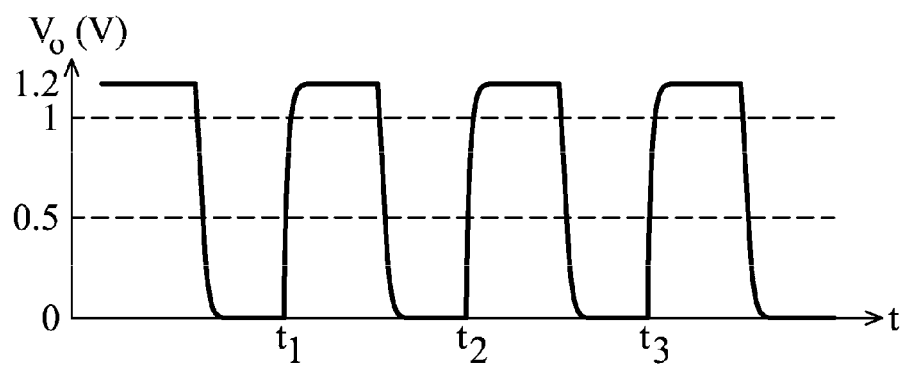

FIG. 4A to FIG. 4D are diagrams illustrating the relationship between various voltage levels and the driving current over time according to the embodiment of FIG. 2B of the invention. In this embodiment, the first voltage level is 1V, the second voltage level s 1.2V, and the third voltage level is 1.8V. As illustrated in FIG. 4B-4D, when the input signal $V_i$ has a low logic level of 0V, the reference signal $V_r$ and the output signal $V_o$ are both at a voltage level of 1.2V. When the input signal $V_i$ has a high logic level of 1V, the reference signal $V_r$ and the output signal $V_o$ are both pulled down to the voltage of 0V (i.e. ground) rapidly. It should be noted from FIG. 4A that the driving current $I_{VDD}$ (i.e., the current supplied from the operation voltage VDD, which comprises a first driving current drawn from the source terminals of the PFET pair MP1 and MP2 and a second driving current drawn from the drain terminal of the NFET pair MN1) peaks when the output signal $V_o$ transits to high logic level (i.e., pulls up), and is approximate to zero at other times including when the output signal $V_o$ is in transition from the high logic level to the low logic level. Accordingly, driving capability is provided while little steady power is consumed by the driving current $I_{VDD}$.

In view of the above, a driving circuit to provide signal voltage levels different from operation voltages is disclosed. Since the circuit design of the driving circuit is simplified, the area and the power consumption of the driving circuit can be reduced when compared with conventional designs.

Figure 5:
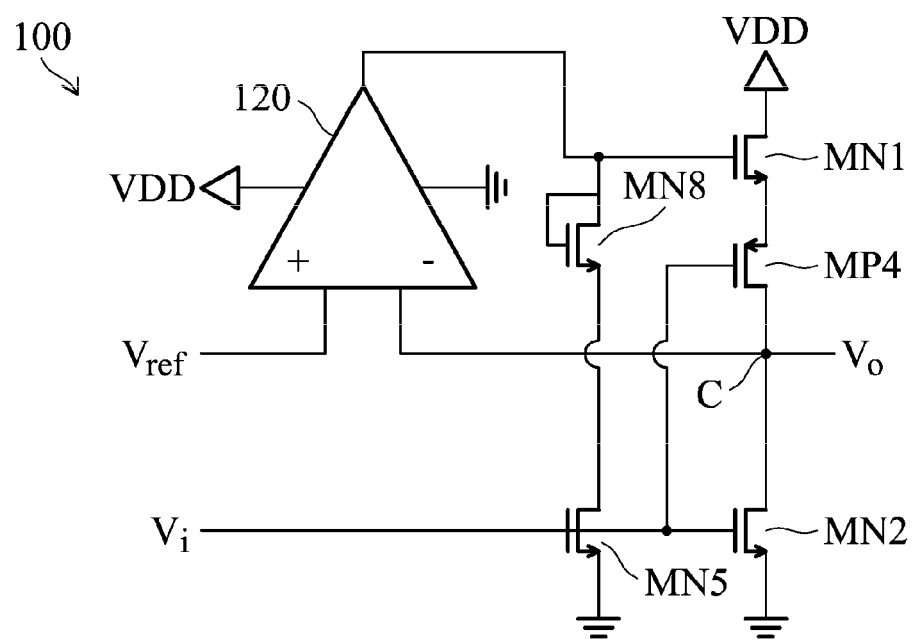
FIG. 5 is a schematic diagram of the driving circuit 100 according to another embodiment of the invention.

FIG. 5 is a schematic diagram of the driving circuit 100 according to another embodiment of the invention. In order to reduce the layout area and adapt to high-speed applications, it is desirable to use low-voltage devices (i.e., devices manufactured by advanced CMOS processes which have lower voltage tolerances) than high-voltage devices in the driving circuit 100. Such low-voltage devices may require their drain-source voltage difference (Vds) to be lower than, for example, 1.2V to prevent drain-source "punch through". The output stage 130 of the driving circuit 100 in FIG. 5 is similar to that in FIG. 2A except for an additional PFET MP4 coupled between the source terminal of the NFET MN1 and the second input terminal of the differential amplifier 120, and an additional NFET MN8 coupled between the drain terminal of the NFET MN5 and the output terminal of the differential amplifier 120. In the embodiment in FIG. 5, the reference voltage $V_{ref}$ is coupled directly to the first input terminal of the differential amplifier 120 without the level shifter 110. In another embodiment, the level shifter 110 may be similarly added as shown in FIG. 2A. The differential amplifier 120 may be similarly implemented in the various ways described above. The PFET MP4 has a gate terminal coupled to the input signal $V_i$, a source terminal coupled to the source terminal of the NFET MN1, and a drain terminal coupled to the second input terminal of the differential amplifier 120. The NFET MN8 has a gate terminal and a drain terminal both coupled to the output terminal of the differential amplifier 120, and a source terminal coupled to the drain terminal of the NFET MN5. The operation of the driving circuit 100 in FIG. 5 is similar to that described above. For example, assuming that the input signal $V_i$ is at a low logic level of 0V, the NFETs MN2 and MN5 are turned off and the PFET MP4 is turned on, so that the NFET MN1 and the PFET MP4 form a negative feedback loop from the output terminal to the second input terminal of the differential amplifier 120. Assuming that $V_i$ is at a high logic level of 1.0V, the NFETs MN2 and MN5 are turned on and the PFET MP4 is turned off, so that the NFET MN1 is turned off and there is no feedback loop. The voltage at the source terminal of MN1 may be decided by the voltage being divided between MN1 and MP4, which are now both off. By designing the aspect ratios of MN1 and MP4, the voltage at the source terminal of MN1 may be designed to be at a voltage level between the operation voltage VDD (e.g., 1.8V) and 0V, such as 1.2V. Therefore, both MN1 and MP4 may have a Vds below 1.2V. The diode-connected MN8 may similarly prevent the Vds of MN5 from exceeding 1.2V, since $V_a$ may be as high as 1.6V, as described above.

Figure 6A:
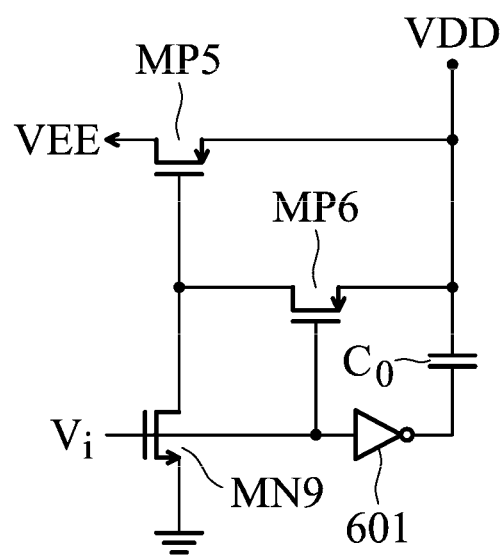
FIG. 6A is a circuit diagram of the switched-capacitor booster 600 according to an embodiment of the invention.

In the embodiments shown in FIG. 1 to FIG. 5, the operation voltage VDD having a third voltage level may be directly provided by the power supply (e.g., an analog power supply of 1.8V). In other embodiments, the operation voltage VDD may be generated by a switched-capacitor booster according to an input-stage voltage VEE (e.g., a digital power supply) which provides the first voltage level for the input signal $V_i$, thereby eliminating the need for an additional high-voltage supply and the corresponding PCB routings. FIG. 6A is a circuit diagram of the switched-capacitor booster 600 according to an embodiment of the invention. The switched-capacitor booster 600 comprises a NFET MN9, PFETs MP5 and MP6, a capacitor $C_0$, and an inverter 601. The NFET MN9 has a gate terminal coupled to the input signal $V_i$, a source terminal coupled to ground, and a drain terminal. The PFET MP5 has a gate terminal coupled to the drain terminal of MN9, a drain terminal coupled to the input-stage voltage VEE, and a source terminal. The PFET MP6 has a gate terminal coupled to the input signal $V_i$, a drain terminal coupled to the drain terminal of MN9, and a source terminal. Both source terminals of MP5 and MP6 are coupled to a first terminal of the capacitor $C_0$, which also provides the operation voltage VDD. An input of the inverter 601 is coupled to the input signal $V_i$, and an output of the inverter 601 (generating the inverse of the input signal V) is coupled to a second terminal of the capacitor $C_0$. For example, assuming that the input signal $V_i$ has a high logic level of 1V, the NFET MN9 is turned on and the PFET MP6 is turned off. Therefore, the PFET MP5 is turned on and the first terminal of the capacitor $C_0$ is charged to the input-stage voltage VEE (e.g., 1V). The second terminal of the capacitor $C_0$ is charged to the inverse of the high logic level 1V, which is the low logic level of 0V. Thusly, a voltage difference of 1V is stored on the capacitor $C_0$. When the input signal $V_i$ has a low logic level of 0V, the NFET MN9 is turned off and the PFET MP6 is turned on, and therefore the PFET MP5 is turned off. The first terminal of the capacitor $C_0$, which provides the operation voltage VDD, is floating in this situation. The second terminal of the capacitor $C_0$ is charged to the inverse of the low logic level 0V, which is the high logic level of 1V, and boosts the voltage level at the first terminal of the capacitor $C_0$ to approximately twice the input-stage voltage VEE. Due to charge flowing from the capacitor $C_0$ to the driving circuit 100, the actual voltage of the operation voltage VDD is around 1.6V to 1.8V, which is high enough for the driving circuit 100 to operate normally. Notably, the generated operation voltage VDD is not a constant DC voltage; however, since the operation voltage VDD is only required to operate the driving circuit 100 to pull up the output signal $V_o$ when the input signal $V_i$ is at the low logic level, the variations of the operation voltage VDD when the input signal $V_i$ is at the high logic level is of little concern.

Figure 6B:
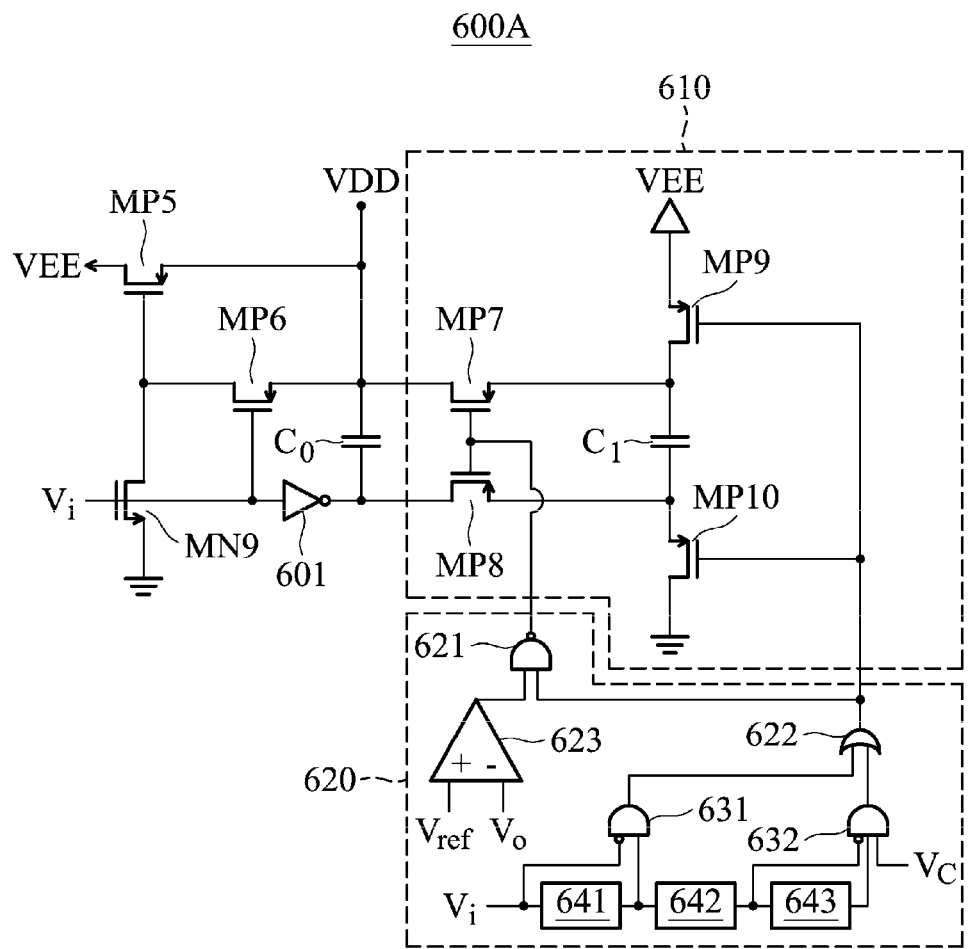
FIG. 6B is a circuit diagram of the switched-capacitor booster 600A according to another embodiment of the invention.

FIG. 6B is a circuit diagram of the switched-capacitor booster 600A according to another embodiment of the invention. When using a switched-capacitor booster to generate the operation voltage VDD, if the output capacitance load is large, the output signal $V_o$ may not reach the required second voltage level of the reference voltage $V_{ref}$ since the capacitor $C_0$ may not provide enough charge to the output capacitance load. Compared to the switched-capacitor booster 600 in FIG. 6A, the switched-capacitor booster 600A further comprises a capacitance adjustment circuit 610 and a charging controller 620. The capacitance adjustment circuit 610 comprises a pair of PFETs MP7 and MP8, which respectively couple the first and second terminal of the capacitor $C_0$ (coupled to the drain terminals of MP7 and MP8, respectively) to a first and second terminal of a capacitor $C_1$ (coupled to the source terminals of MP7 and MP8, respectively) according to a first charging signal $V_{Gp7,8}$ coupled to the gate terminals of both MP7 and MP8. The capacitance adjustment circuit 610 further comprises a pair of PFETs MP9 and MP10, which respectively couple the first and second terminal of the capacitor $C_1$ to the input-stage voltage VEE and ground according to a second charging signal $V_{GP9,10}$ coupled to the gate terminals of both MP9 and MP10. The PFET MP9 has a source terminal coupled to the input-stage voltage VEE and a drain terminal coupled to the first terminal of the capacitor $C_1$, and the PFET MP10 has a source terminal coupled to the second terminal of the capacitor $C_1$ and a drain terminal coupled to ground. Therefore, the pair of PFETs MP7 and MP8 couple the capacitor $C_1$ in parallel with the capacitor $C_0$ (thus increasing the overall capacitance and stored charge at the operation voltage VDD) when the first charging signal $V_{GP7,8}$ is logic "low", and the pair of PFETs MP9 and MP10 charge the capacitor $C_1$ to a voltage difference of the input-stage voltage VEE (i.e., first voltage level) when the second charging signal $V_{GP9,10}$ is logic "low". Both the first charging signal $V_{GP7,8}$ and the second charging signal $V_{GP9,10}$ are generated by the charging controller 620. In one embodiment, the first charging signal $V_{GP7,8}$ is the inverse of the second charging signal $V_{GP9,10}$. In another embodiment, the first charging signal $V_{GP7,8}$ is logic "low" only when the second charging signal $V_{GP9,10}$ is logic "high" and the output signal $V_o$ is lower than the reference voltage $V_{ref}$ by more than a certain offset value. Such a design only couples the capacitor $C_1$ in parallel with the capacitor $C_0$ to provide the operation voltage VDD when $V_o$ is substantially lower than the reference voltage $V_{ref}$ (indicating a large output capacitance load), and thus reduces the discharging power consumption of the capacitor $C_1$.

Referring to FIG. 6B, in one embodiment, the charging controller 620 comprises logic gates 621, 622, 631, and 632, a comparator 623, and time delay circuits 641, 642, and 643. One having ordinary skill in the art will appreciate that the time delay circuits 641-643 may be implemented in various ways and may be any circuit that provides a time delay between the signals at its input and output terminals. The time delay circuits 641-643 are sequentially coupled in series with the time delay circuit 641 receiving the input signal $V_i$ as input. The logic gate 631 may be an AND gate, having an output, a first input receiving the inverse of the input signal $V_i$, and a second input receiving the output from the time delay circuit 641 (i.e., the input signal $V_i$ with one time delay). The logic gate 632 may be an AND gate, having an output, a first input receiving the inverse of the output from the time delay circuit 642 (i.e., the input signal $V_i$ with two time delays), and a second input receiving the output from the time delay circuit 643 (i.e., the input signal $V_i$ with three time delays). In one embodiment, the logic gate 632 may further comprise a third input receiving a control signal $V_c$, wherein when the control signal $V_i$ is logic low, the capacitor $C_1$ is charged/discharged once during each period (i.e. a complete clock cycle) of the input signal $V_i$, and when the control signal $V_i$ is logic high (or, when there is no third input receiving the control signal $V_c$), the capacitor $C_1$ is charged/discharged twice during each period of the input signal $V_i$. The logic gate 622 may be an OR gate, having an output generating the second charging signal $V_{GP9,10}$, a first input coupled to the output of the logic gate 631, and a second input coupled to the output of the logic gate 632. The comparator 623 may have an offset value (for example, 0.05V) and comprise a first input terminal coupled to the reference voltage $V_{ref}$ (e.g., 1.2V), a second input terminal coupled to the output signal $V_o$, and an output terminal. The output terminal of the comparator 623 may output logic "high" when the output signal $V_o$ is lower than the reference voltage $V_{ref}$ by more than the offset value (e.g., $V_o$<1.15V), and may output logic "low" otherwise. The logic gate 621 may be a NAND gate, having an output generating the first charging signal $V_{GP7,8}$, a first input coupled to the output of the logic gate 622, and a second input coupled to the output terminal of the comparator 623.

Figure 6C:
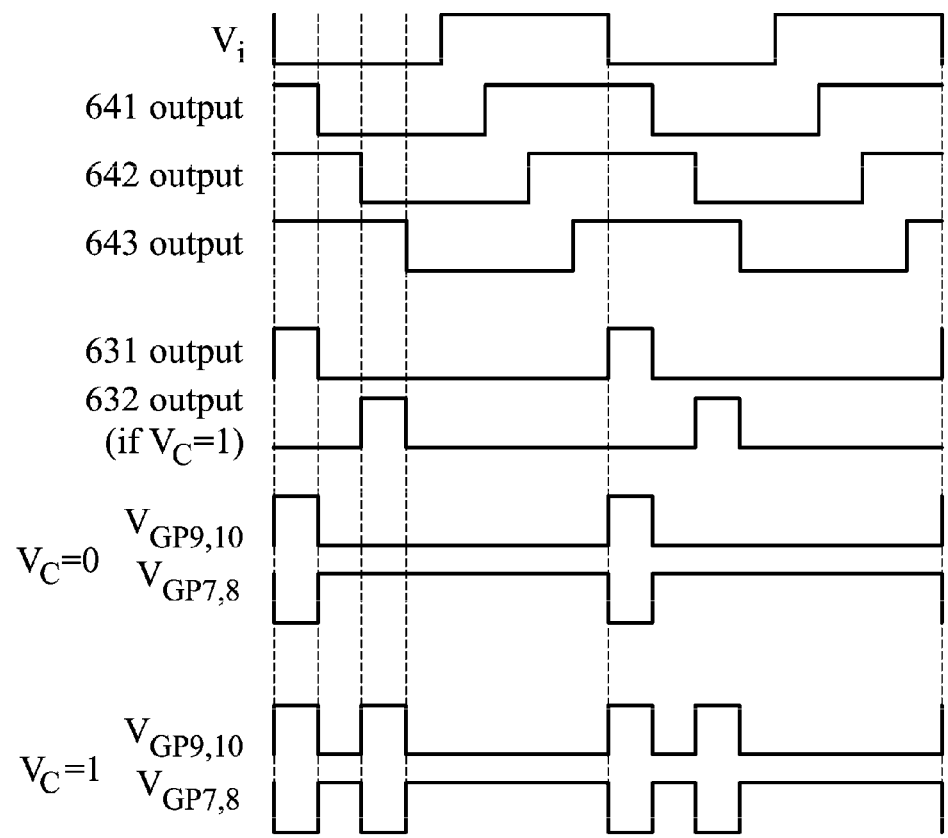
FIG. 6C is a diagram illustrating the waveforms of the output of the main logic gates and the charging signals when the comparator 623 outputs logic "high" according to an embodiment of the invention.

FIG. 6C is a diagram illustrating the waveforms of the output of the main logic gates and the charging signals when the comparator 623 outputs logic "high" according to an embodiment of the invention. It can be seen that, when the control signal $V_c$ is logic "low", the capacitor $C_1$ is charged/discharged once during each period of the input signal $V_i$, and when the control signal $V_c$ is logic "high", the capacitor $C_1$ is charged/discharged twice during each period of the input signal $V_i$. As the capacitor $C_1$ is charged/discharged more than one time per period, the capacitor $C_1$ may provide more charge to the output capacitance load, and thus the driving capability is greatly enhanced. By similarly increasing the number of time delay circuits in series and logic gates (i.e., logic gate 632), the charging controller 620 may be configured to charge/discharge more than twice during each period of the input signal $V_i$. In another embodiment, the time delay circuits 642 and 643 and the logic gates 622 and 632 may be removed and the first input of the logic gate 621 may be coupled to the output of the logic gate 631 (which generates the second charging signal $V_{GP9,10}$) if the capacitor $C_1$ only needs to be charged/discharged once during each period. In some embodiments, the comparator 623 may be removed and the logic gate 621 may be an inverter having an input coupled to the output of the logic gate 622 and an output generating the first charging signal $V_{GP7,8}$ (i.e., the first charging signal $V_{GP7,8}$ is the inverse of the second charging signal $V_{GP9,10}$). In this embodiment, the capacitor $C_1$ is coupled in parallel with the capacitor $C_0$ to provide the operation voltage VDD regardless of the voltage levels of the output signal $V_o$ and the reference voltage $V_{ref}$.

Figure 7:
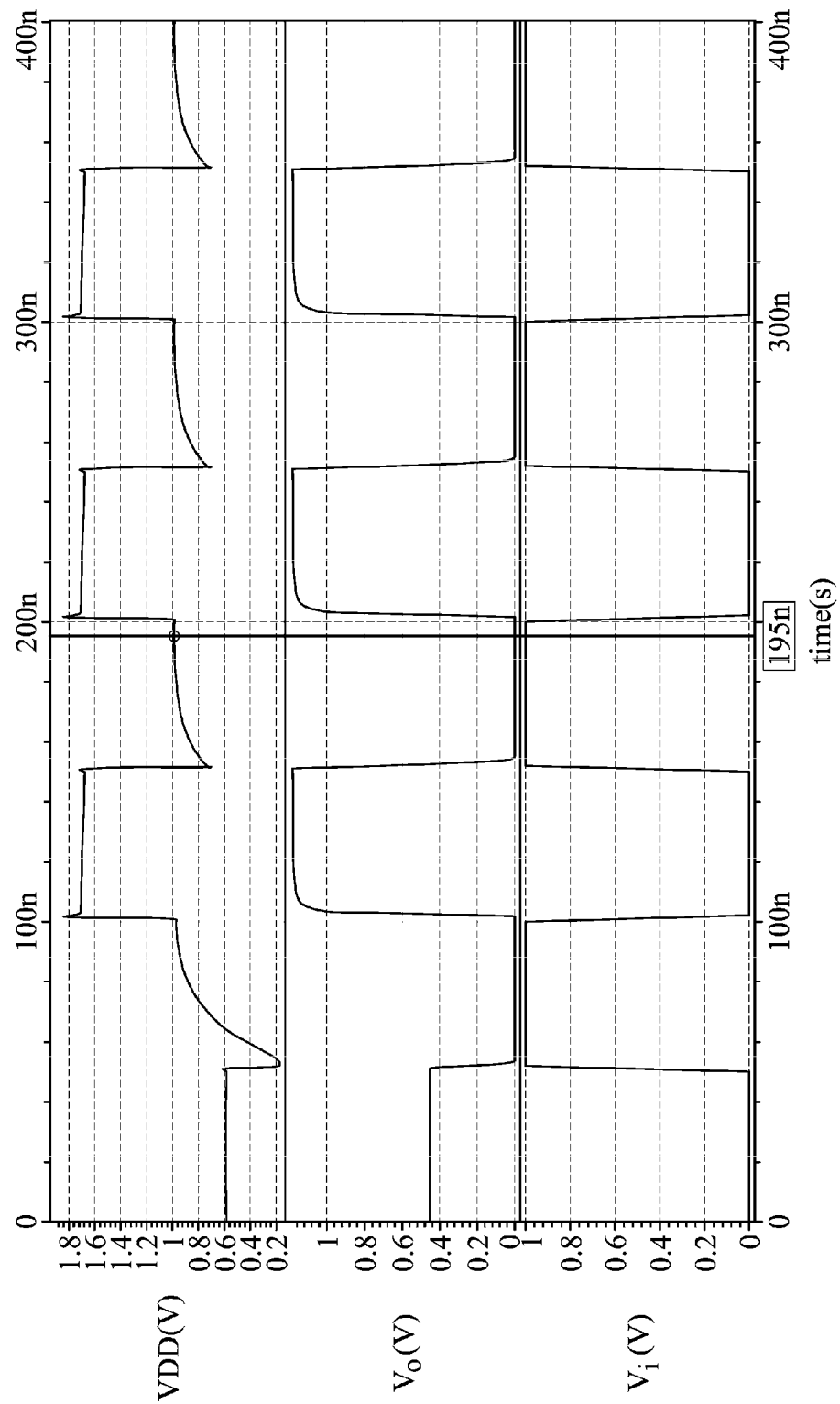
FIG. 7 is a diagram illustrating the relationship between the operation voltage VDD, the input signal $V_i$, and the output signal $V_o$ over time according to the embodiment of FIG. 6A.

FIG. 7 is a diagram illustrating the relationship between the operation voltage VDD, the input signal $V_i$ and the output signal $V_o$ over time according to the embodiment of FIG. 6A. In this embodiment, the first voltage level is 1V and the second voltage level s 1.2V. As illustrated in FIG. 7, when the input signal $V_i$ has a high logic level of 1V, the operation voltage VDD is charged to 1V; however, since the output signal $V_o$ is at a low logic level of 0V, it is not affected by the actual voltage level of VDD. When the input signal $V_i$ has a low logic level of 0V, the operation voltage VDD is boosted to approximately twice 1V (i.e., 2V). Due to charge flowing from the capacitor $C_0$ to the driving circuit 100, the actual voltage of the operation voltage VDD is around 1.6V to 1.8V, which is high enough for the driving circuit 100 to operate normally as can be seen from the high logic level of 1.2V of the output signal $V_o$.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A driving circuit generating an output signal according to an input signal generated from an input-stage voltage with a first voltage level and a reference voltage with a second voltage level, comprising:
    a differential amplifier having a first input terminal coupled to the reference voltage, a second input terminal coupled to the output signal, and an output terminal, wherein the differential amplifier is supplied by an operation voltage with a third voltage level; and
    an output stage, coupled to the second input terminal and the output terminal of the differential amplifier, configured to receive the input signal and the operation voltage to generate the output signal,
    wherein the second input terminal is coupled to the output terminal of the differential amplifier according to the input signal,
    wherein the first voltage level is lower than the third voltage level, and the second voltage level is between the first voltage level and the third voltage level,
    wherein the operation voltage is generated according to the input signal and the input-stage voltage.

2. The driving circuit as claimed in claim 1, wherein the output stage comprises:
    a first N-type transistor having a gate terminal coupled to the output terminal of the differential amplifier, a drain terminal coupled to the operation voltage, and a source terminal coupled to the second input terminal of the differential amplifier;
    a second N-type transistor having a gate terminal coupled to the input signal, a drain terminal coupled to the second input terminal of the differential amplifier, and a source terminal coupled to ground; and
    a fifth N-type transistor having a gate terminal coupled to the input signal, a drain terminal coupled to the output terminal of the differential amplifier, and a source terminal coupled to the ground,
    wherein the output signal is generated at the second input terminal of the differential amplifier.

3. The driving circuit as claimed in claim 2, wherein the output stage further comprises:
    a fourth P-type transistor having a gate terminal coupled to the input signal, a drain terminal coupled to the second input terminal of the differential amplifier, and a source terminal coupled to the source terminal of the first N-type transistor.

4. The driving circuit as claimed in claim 2, wherein the output stage further comprises:
    an eighth N-type transistor having a gate terminal and a drain terminal both coupled to the output terminal of the differential amplifier and a source terminal coupled to the drain terminal of the fifth N-type transistor.

5. The driving circuit as claimed in claim 1, wherein the differential amplifier comprises:
    a first P-type transistor having a gate terminal coupled to a drain terminal, and a source terminal coupled to the operation voltage;
    a second P-type transistor having a gate terminal coupled to the gate terminal of the first P-type transistor, a source terminal coupled to the operation voltage, and a drain terminal;
    a sixth N-type transistor having a drain terminal coupled to the drain terminal of the first P-type transistor, a source terminal, and a gate terminal; and
    a seventh N-type transistor having a drain terminal coupled to the drain terminal of the second P-type transistor, a source terminal coupled to the source terminal of the sixth N-type transistor, and a gate terminal,
    wherein the gate terminal of the sixth N-type transistor is the first input terminal of the differential amplifier, the gate terminal of the seventh N-type transistor is the second input terminal of the differential amplifier, and the drain terminal of the second P-type transistor is the output terminal of the differential amplifier.

6. The driving circuit as claimed in claim 5, wherein the differential amplifier further comprises:
    a third N-type transistor having a gate terminal coupled to a bias voltage, a drain terminal coupled to the source terminal of the sixth N-type transistor, and a source terminal coupled to the ground,
    wherein the differential amplifier is enabled/disabled by turning on/off the third N-type transistor based on the bias voltage.

7. The driving circuit as claimed in claim 5, wherein differential amplifier further comprises:
    a current source coupled between the source terminal of the sixth N-type transistor and ground.

8. The driving circuit as claimed in claim 1, wherein the reference voltage is generated by a bandgap voltage reference circuit.

9. The driving circuit as claimed in claim 1, further comprising a level shifter coupled to the differential amplifier and configured to receive the reference voltage and the input signal to generate a reference signal, wherein the first input terminal of the differential amplifier is coupled to the reference signal.

10. The driving circuit as claimed in claim 9, wherein the level shifter comprises:
    a third P-type transistor, having a source terminal coupled to the reference voltage, a gate terminal coupled the input signal, and a drain terminal coupled to the reference signal; and
    a fourth N-type transistor, having a source terminal coupled to ground, a gate terminal coupled the input signal, and a drain terminal coupled to the reference signal.

11. The driving circuit as claimed in claim 1, wherein the operation voltage is generated by a switched-capacitor booster, the switched-capacitor booster comprising:
- a ninth N-type transistor having a gate terminal coupled to the input signal, a drain terminal, and a source terminal coupled to ground;
- a fifth P-type transistor having a gate terminal coupled to the drain terminal of the ninth N-type transistor, a source terminal coupled to a first terminal of a first capacitor, and a drain terminal coupled to the input-stage voltage; and
- a sixth P-type transistor having a gate terminal coupled to the input signal, a drain terminal coupled to the drain terminal of the ninth P-type transistor, and a source terminal coupled to the first terminal of the first capacitor,
- wherein a second terminal of the first capacitor is coupled to the inverse of the input signal and the operation voltage is generated at the first terminal of the first capacitor.

12. The driving circuit as claimed in claim 11, wherein the switched-capacitor booster further comprises:
- a seventh P-type transistor having a gate terminal coupled to a first charging signal, a drain terminal coupled to the first terminal of the first capacitor, and a source terminal coupled to a first terminal of a second capacitor;
- an eighth P-type transistor having a gate terminal coupled to the first charging signal, a drain terminal coupled to the second terminal of the first capacitor, and a source terminal coupled to a second terminal of the second capacitor;
- a ninth P-type transistor having a gate terminal coupled to a second charging signal, a drain terminal coupled to the first terminal of the second capacitor, and a source terminal coupled to the input-stage voltage; and
- a tenth P-type transistor having a gate terminal coupled to the second charging signal, a drain terminal coupled to the ground, and a source terminal coupled to the second terminal of the second capacitor.

13. The driving circuit as claimed in claim 12, wherein the first charging signal is the inverse of the second charging signal.

14. The driving circuit as claimed in claim 13, wherein the switched-capacitor booster further comprises:
- a first logic gate having a first input receiving the inverse of the input signal, a second input receiving the input signal with a time delay, and an output generating the second charging signal.

15. The driving circuit as claimed in claim 13, wherein the switched-capacitor booster further comprises:
- a first logic gate having a first input receiving the inverse of the input signal, a second input receiving the input signal with a time delay, and an output;
- a second logic gate having a first input receiving the inverse of the input signal with two time delays, a second input receiving the input signal with three time delays, and an output; and
- a third logic gate having a first input coupled to the output of the first logic gate, a second input coupled to the output of the second logic gate, and an output generating the second charging signal.

16. The driving circuit as claimed in claim 15, wherein the second logic gate further has a third input receiving a control signal, wherein when the control signal is logic low, the second capacitor is charged/discharged once during each period of the input signal, and when the control signal is logic high, the second capacitor is charged/discharged twice during each period of the input signal.

17. The driving circuit as claimed in claim 12, wherein the first charging signal is logic low only when the second charging signal is logic high and the output signal is lower than the reference voltage by more than an offset value.

18. The driving circuit as claimed in claim 17, wherein the switched-capacitor booster further comprises:
- a first logic gate having a first input receiving the inverse of the input signal, a second input receiving the input signal with a time delay, and an output generating the second charging signal;
- a comparator having a first input terminal coupled to the reference voltage, a second input terminal coupled to the output signal, and an output terminal; and
- a fourth logic gate having a first input coupled to the output of the first logic gate, a second input coupled to the output terminal of the comparator, and an output generating the first charging signal,
- wherein the output terminal of the comparator outputs logic high when the output signal is lower than the reference voltage by more than the offset value, and outputs logic low otherwise.

19. The driving circuit as claimed in claim 17, wherein the switched-capacitor booster further comprises:
- a first logic gate having a first input receiving the inverse of the input signal, a second input receiving the input signal with a time delay, and an output;
- a second logic gate having a first input receiving the inverse of the input signal with two time delays, a second input receiving the input signal with three time delays, and an output;
- a third logic gate having a first input coupled to the output of the first logic gate, a second input coupled to the output of the second logic gate, and an output generating the second charging signal;
- a comparator having a first input terminal coupled to the reference voltage, a second input terminal coupled to the output signal, and an output terminal; and
- a fourth logic gate having a first input coupled to the output of the third logic gate, a second input coupled to the output terminal of the comparator, and an output generating the first charging signal,
- wherein the output terminal of the comparator outputs logic high when the output signal is lower than the reference voltage by more than the offset value, and outputs logic low otherwise.

20. The driving circuit as claimed in claim 19, wherein the second logic gate further has a third input receiving a control signal, wherein when the control signal is logic low, the second capacitor is charged/discharged once during each period of the input signal, and when the control signal is logic high, the second capacitor is charged/discharged twice during each period of the input signal.

* * * * *